United States Patent [19]

Froberg

[11] 4,048,953
[45] Sept. 20, 1977

[54] APPARATUS FOR VAPOR DEPOSITING PYROLYTIC CARBON ON POROUS SHEETS OF CARBON MATERIAL

[75] Inventor: Robert W. Froberg, Easton, Pa.

[73] Assignee: Pfizer Inc., New York, N.Y.

[21] Appl. No.: 642,607

[22] Filed: Dec. 19, 1975

Related U.S. Application Data

[63] Continuation-in-part of Ser. No. 480,922, June 19, 1974, Pat. No. 3,944,686.

[51] Int. Cl.$^2$ .................................. C23C 13/08
[52] U.S. Cl. ................................................ 118/49
[58] Field of Search ........................ 118/48–49.5, 118/50, 50.1; 34/92, 242; 427/50–52, 69, 70, 78, 91, 99, 109, 124, 248–252

[56] References Cited

U.S. PATENT DOCUMENTS

| | | | |
|---|---|---|---|
| 2,789,064 | 4/1957 | Schladitz | 118/49 X |
| 3,043,715 | 7/1962 | Clough | 118/49.1 X |
| 3,190,262 | 6/1965 | Bakish | 118/48 |
| 3,294,670 | 12/1966 | Charschan et al. | 118/49 X |
| 3,352,129 | 11/1967 | Johnson | 34/242 X |
| 3,381,114 | 4/1968 | Nakanuma | 118/49.5 X |
| 3,440,136 | 4/1969 | Nelson et al. | 34/242 X |
| 3,672,948 | 6/1972 | Foehring et al. | 118/48 X |
| 3,854,443 | 12/1974 | Baerg | 118/49 |

FOREIGN PATENT DOCUMENTS

| | | | |
|---|---|---|---|
| 492,464 | 3/1954 | Italy | |
| 766,459 | 1/1957 | United Kingdom | 118/49 |

Primary Examiner—Morris Kaplan
Attorney, Agent, or Firm—Connolly and Hutz

[57] ABSTRACT

An elongated continuous porous sheet of fibrous carbon, such as paper of matted graphite fibers, woven graphite cloth or carbonized filter paper is longitudinally traversed through a reduced pressure heating zone (5mm. of Hg.) in which hydrocarbon gas is perpendicularly directed at relatively high velocities through restricted flow passages at the sheet, which is heated to a temperature of about 2200° C. The flow passages are disposed in polycrystalline graphite guide plates forming a narrow slot through which the material passes. The gas flow cools the passages and prevents the hydrocarbon content from depositing out on and clogging them. The hydrocarbon gas impinges on the heated fibers and forms a deposit of pyrolytic carbon on them, which is heavier in back than in front. A pair of 13 mil. thick sheets are effectively infiltrated within a 40 mil. deep slot. The sheets are traversed at a speed of about 60 to 3600 feet per hour at a temperature of about 2000° to 2400° C at a pressure of from about 4 to 20 mm. Hg. A hydrocarbon gas at a flow rate of from about 5 to 20 c.f.m. effectively infiltrates the carbon sheet material and increases the sheet density by at least 20 grams per square meter. The velocity of the carbon depositing flow stream is maintained at from about 20 to 200 ft. per minute (STP).

27 Claims, 15 Drawing Figures

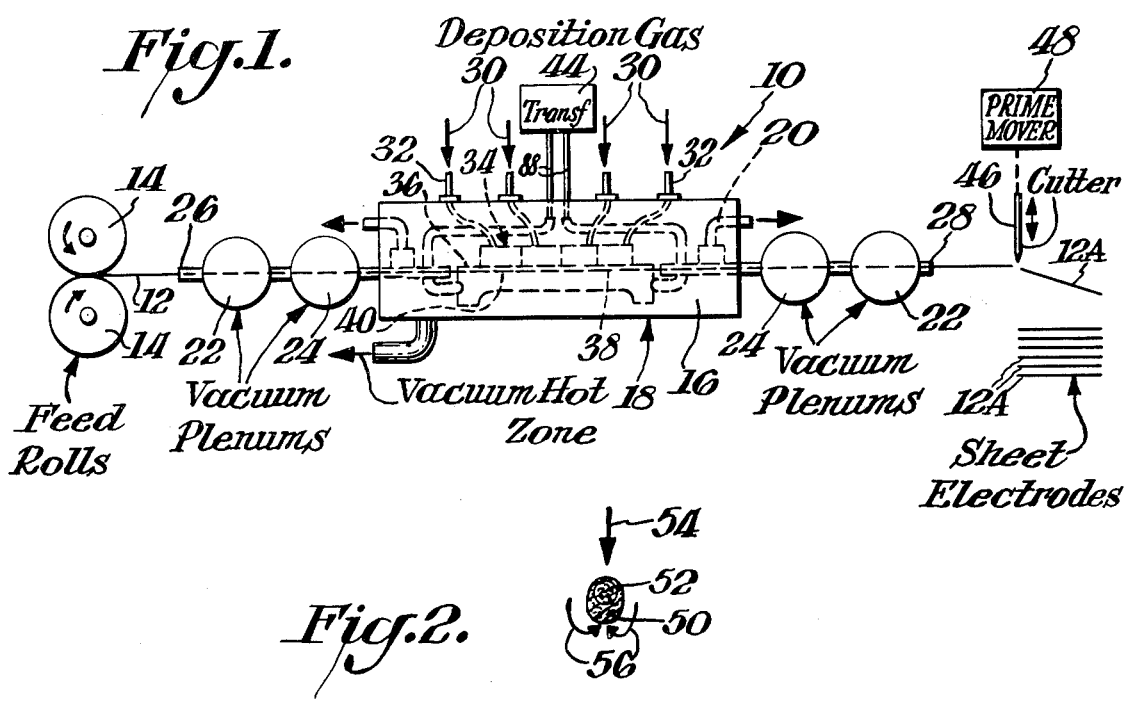
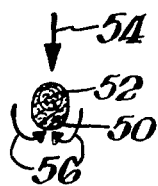
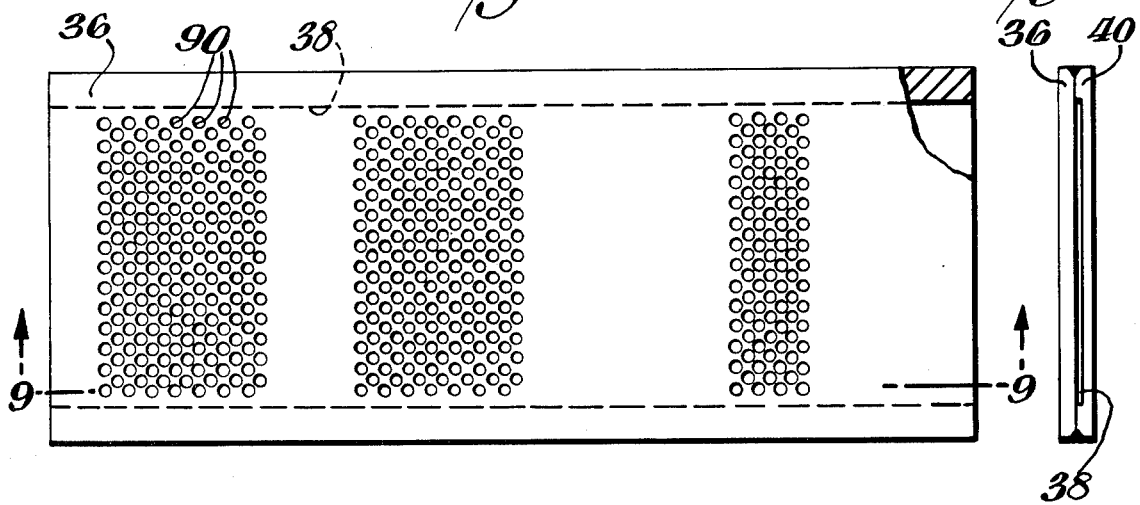
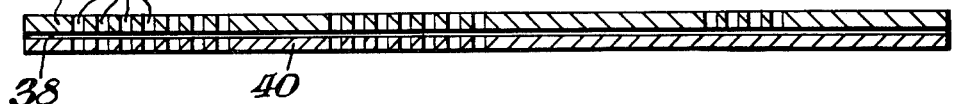

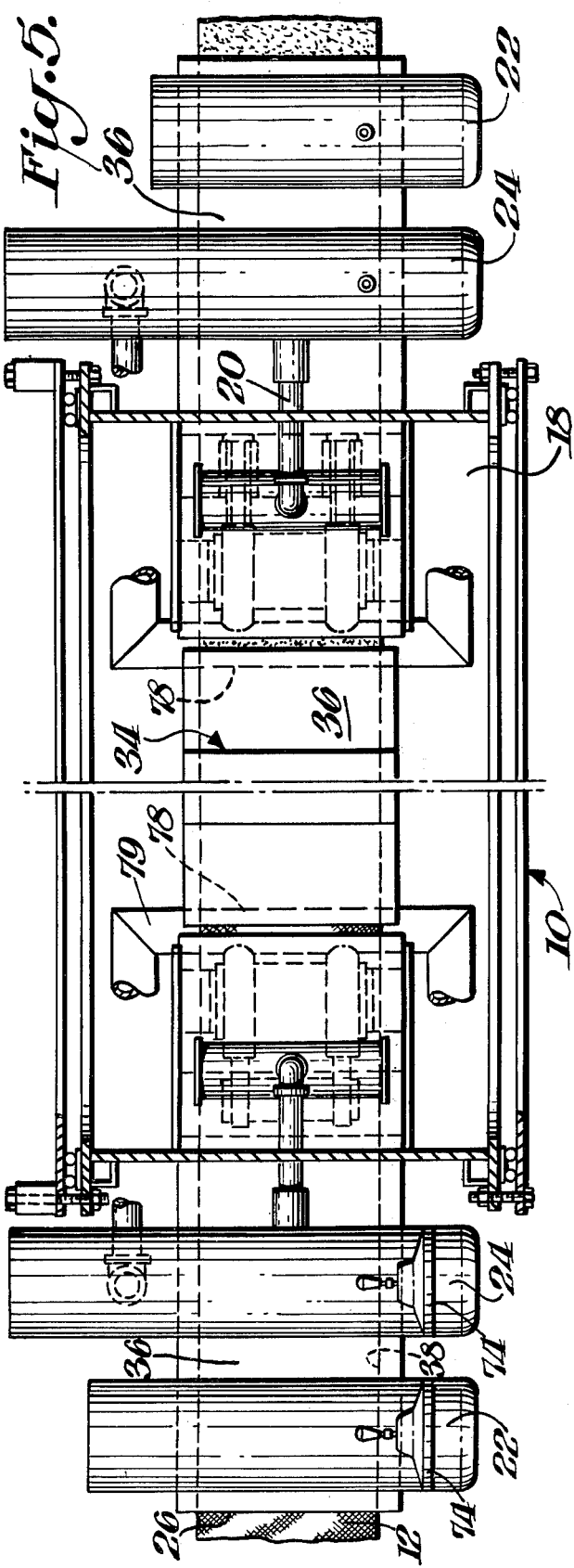
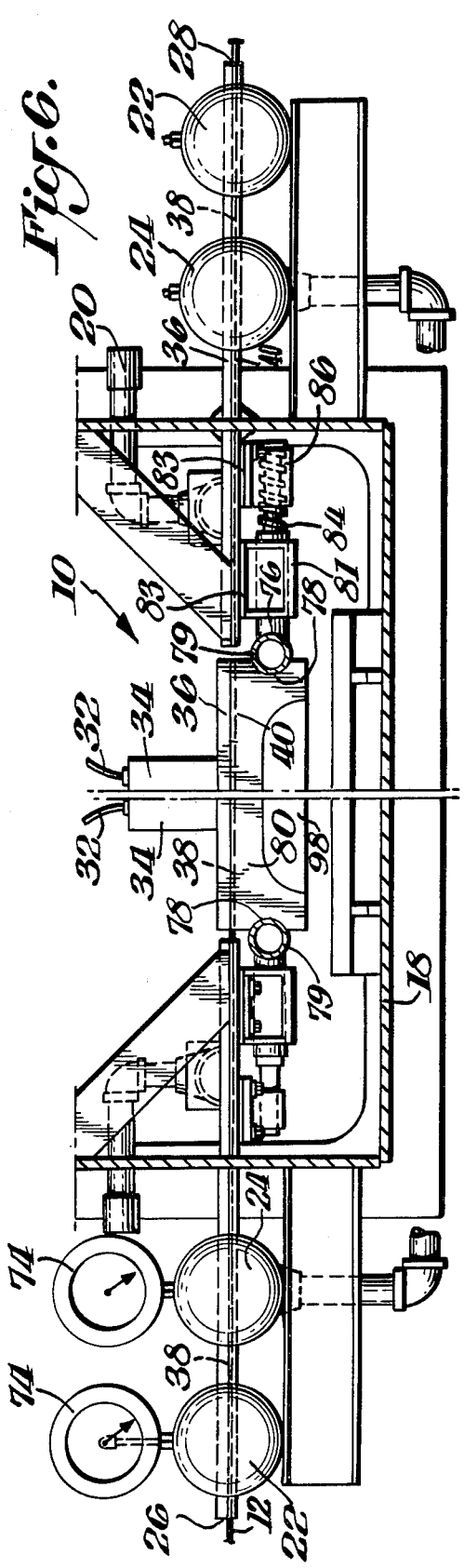

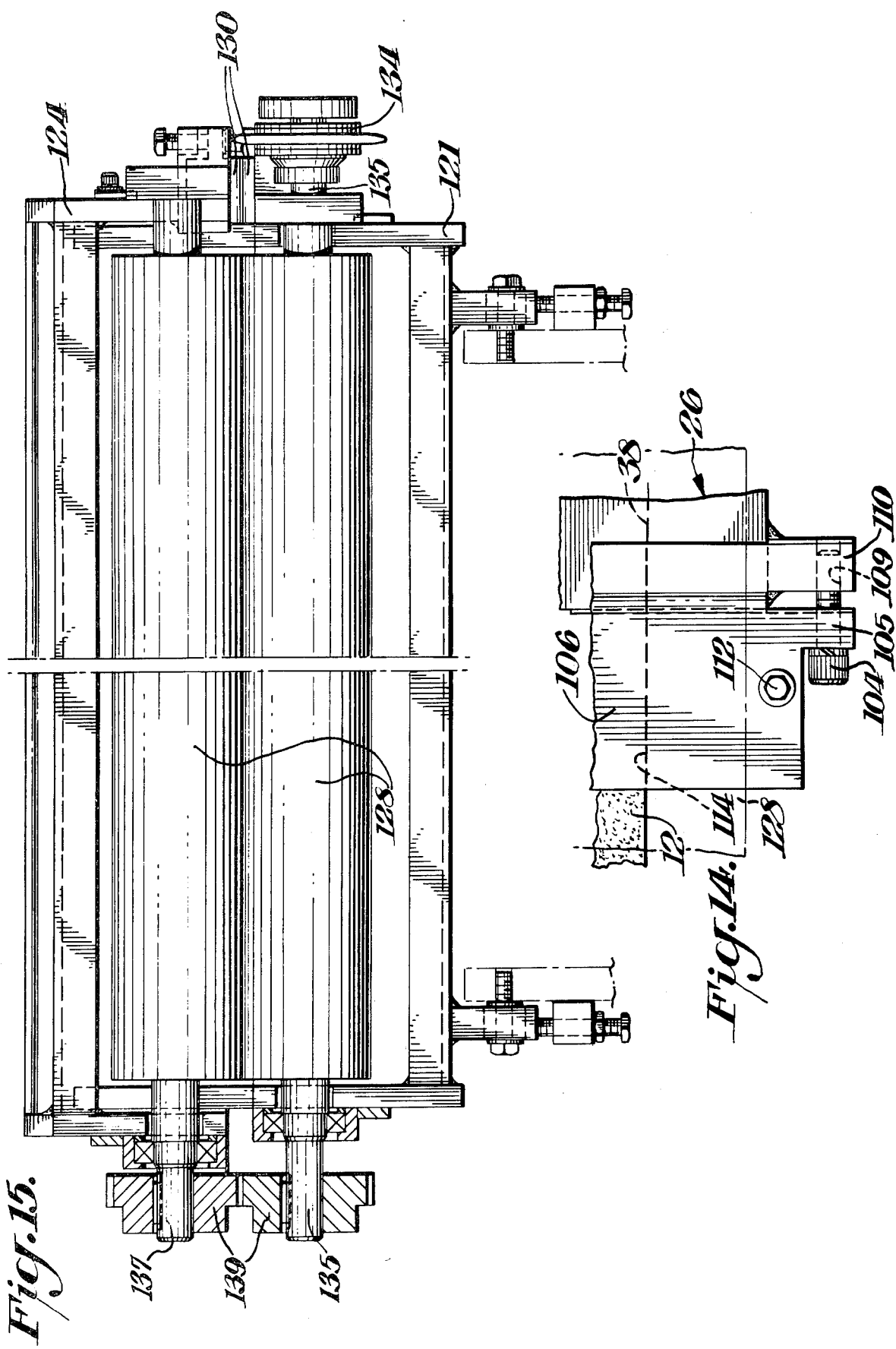

APPARATUS FOR VAPOR DEPOSITING PYROLYTIC CARBON ON POROUS SHEETS OF CARBON MATERIAL

CROSS REFERENCE TO RELATED APPLICATIONS

This application is a continuation-in-part of copending commonly assigned U.S. patent application Ser. No. 480,922, filed June 19, 1974 now U.S. Pat. No. 3,944,686.

BACKGROUND OF THE INVENTION

Sheets of carbon infiltrated with pyrolytic graphite are very useful as electrodes in fuel cells. These infiltrated sheets have heretofore been individually infiltrated in batches. An object of this invention is to provide an effective method and apparatus for making continuous vapor deposits of pyrolytic graphite on porous carbon sheets of fibrous material.

SUMMARY

In accordance with this invention, an elongated sheet of porous fibrous carbon is infiltrated with pyrolytic graphite by longitudinally traversing it through a treating zone where it is heated to a relatively high temperature capable of depositing pyrolytic graphite from a hydrocarbon gas. The treating zone is maintained at a subatmospheric pressure, and a flow of hydrocarbon gas is impinged on the sheet at a relatively high velocity through a number of substantially narrow flow streams. This deposits pyrolytic graphite on the sheet without obstructing the flow of streams. Advantageous deposits are obtained by traversing the sheets at speeds ranging from about 60–3600 ft. per hour through a heating zone maintained at a temperature of from about 2000–2400° C and at a subatmospheric pressure ranging from about 3–20 mm. of Hg.

Clogging of the carbon depositing flow streams is avoided by maintaining their velocity at speeds ranging from about 20 to 200 (STP) ft. per min. The elongated sheet can be divided up into smaller sheets after passage through the treating zone. The required subatmospheric pressure in the treating zone is facilitated by maintaining auxiliary zones on both sides of the treating zone at subatmospheric pressures ranging from about 5–760 mm. of Hg. and most effectively by the use of tandem subatmospheric auxiliary zones having outer tandem zones ranging from about 760–70 mm. of Hg. and inner tandem auxiliary zones ranging from about 70–5 mm. of Hg.

A highly effective apparatus for the continuous vapor deposition of pyrolytic graphite on porous fibrous sheets of carbon material includes a subatmospheric chamber within which the elongated sheet is longitudinally traversed in a narrow slot between a pair of elongated guide plates. A number of flow passages through the guide plates intersect the slot to impinge a relatively high velocity flow of hydrocarbon gas on the sheet passing through it. The lower plate and indirectly the sheet are heated to the deposition temperature by passing an electrical current through the lower plate. The flow of gas through the many narrow flow passages in the guide plates cools them and concentrates the deposition of pyrolytic graphite on the heated sheets. This prevents the flow passages from being clogged with deposited graphite. The treating chamber is maintained at a subatmospheric pressure from about 3–20 mm. of Hg. and tandem pairs of subatmospheric antechambers may be disposed on both ends of the subatmospheric chamber to help maintain the subatmospheric pressure in it. The sheets are guided into and out of the subatmospheric antechamber within pairs of endless belts which shield them from aerodynamic disturbances and concomitant shear forces. A cutter may be disposed at the end of the apparatus to cut the elongated sheet into a number of individual sheets. A slot about 40 mils thick can suitably accommodate a pair of 13 mil. thick sheets. The guide plates may effectively be provided by ported blocks of polycrystalline graphite with which entrance and exit tubes may be aligned.

BRIEF DESCRIPTION OF THE DRAWINGS

Novel features and advantages of the present invention will become apparent to one skilled in the art from a reading of the following description in conjunction with the accompanying drawings wherein similar reference characters refer to similar parts and in which:

FIG. 1 is a diagrammatic view in elevation of a continuous carbon vapor depositing apparatus which is one embodiment of this invention;

FIG. 2 is a diagrammatic view in elevation showing the manner in which pyrolytic graphite deposits on a fiber during the operation of this invention;

FIG. 5 is a cross-sectional view taken through FIG. 4 along the line 5—5;

FIG. 6 is a cross-sectional view taken through FIG. 3 along the line 6—6;

FIG. 7 is a top plan view of the guide plates used in the apparatus shown in FIGS. 5 and 6;

FIG. 8 is an end view of the guide plates shown in FIG. 7;

FIG. 9 is a cross-sectional view taken through FIG. 7 along the line 9—9;

FIG. 14 is a fragmental cross-sectional view taken through FIG. 13 along the line 14—14; and FIG. 15 is a right and view of the device shown in FIG. 13 with an intermediate break.

DESCRIPTION OF THE PREFERRED EMBODIMENTS

Figure 3:
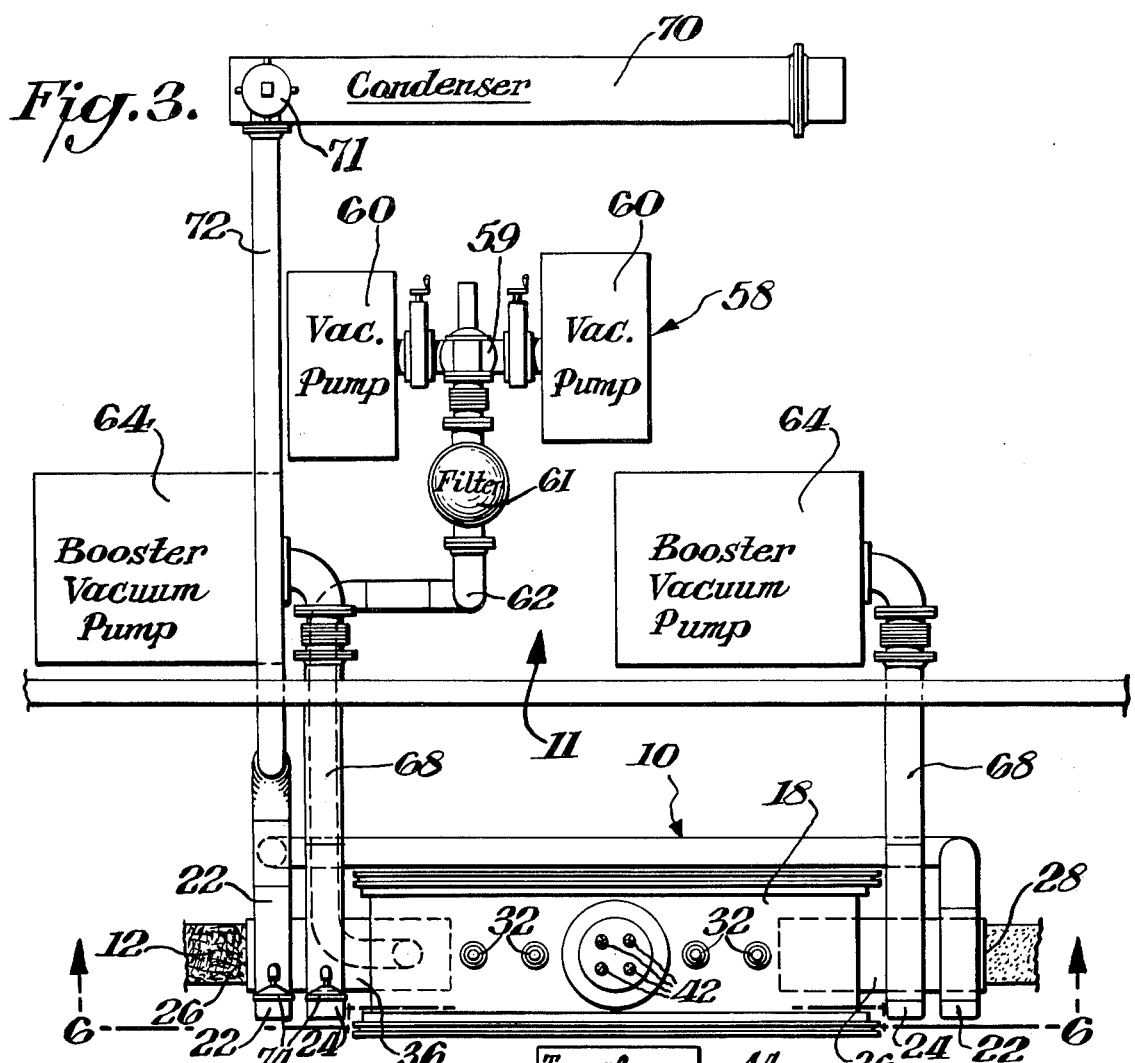
FIG. 3 is a top plan view of a continuous carbon vapor depositing apparatus and auxiliary equipment.

In FIG. 1 is shown a continuous carbon vapor depositing apparatus 10 for infiltrating an elongated sheet 12 of porous fibrous carbon with pyrolytic graphite. Pyrolytic graphite is anisotropic graphite, which is deposited at high temperatures from a hydrocarbon gas. The basal planes are randomly stacked, which causes a marked directional difference in physical, thermal and electrical properties. A principal anisotropic property is thermal conductivity in the planar direction similar to copper, whereas, it is an excellent insulator similar to a phenolic plastic in the direction through the thickness.

Sheet 12 supplied between feed rolls 14 is for example a carbon or graphite material, such as; a paper of matted graphite fibers; a woven graphite cloth or carbonized cellulosic paper. After the porous fibrous carbon material is infiltrated with pyrolytic graphite in apparatus 10, it is extremely well adapted for use as an electrode in a fuel cell, such as oxygen-hydrogen fuel cell like those used in stationary fuel cells.

Sheet 12 is, for example, a pair of continuous elongated sheets of porous fibrous graphite, each about 13 mils thick. Sheet 12 also may be a single thickness about 26 mils thick and about eight to thirteen inches wide. The ultimate infiltrated material will have an electrical resistivity of less than 0.02 ohm-cm, porosity of 60-80% and a mean pore diameter of about 60 microns.

Sheet 12 is infiltrated in a treating zone 16 within subatmospheric pressure chamber 18, which is maintained by drawing a vacuum through vacuum service equipment 58 (later described). A pair of tandem vacuum plenums or antechambers 22 and 24 on both ends of chamber 18 help maintain the subatmospheric pressure in the chamber as the sheet is continuously fed into and out of it through entrance throat 26 and exit 28. Safety seals 20 are supplied with an inert gas, such a nitrogen, in an emergency, if the seal on the system should be lost, to prevent air from rushing into the hot zone.

Main subatmospheric chamber 18 is maintained about from 3-70 mm. of Hg. and outer auxiliary vacuum plenums or antechambers 22 are maintained at a subatmospheric pressure ranging from about 760-70 mm. of Hg. Inner vacuum plenums or antechambers 24 are maintained at about 70-3 mm. of Hg. The subatmospheric pressure reduces hydrocarbon molecular collisions and minimizes sooting.

Hydrocarbon gas is supplied in the direction of arrows 30 to chamber 18 through supply tubes 32 leading to distributing chambers 34 connected above upper perforated guide plate 36 (later described). The hydrocarbon gas is for example comprised of acetylene, natural gas, methane, or the like supplied at a rate of about 4-100 C.F.M. and preferably at about 40 c.f.m. The supplied gas can also include diluents such as hydrogen, nitrogen, ammonia, argon, etc., and mixtures thereof.

Guide plate 36 helps form a guide slot 38 for longitudinal traversal by sheet 12 in conjunction with lower perforated guide plate 40 (also later described). Lower guide plate 40 is heated by current from electrical power cables 88 connected and supplies through transformer 44 to provide heat to slot 38 and sheet 12 passing through it. Chamber 18 is according maintained at a pyrolytic graphite depositing temperature of from about 2000°-2400° C preferably at about 2200° C.

After passage through chamber 18 and auxiliary vacuum plenums 24 and 22, sheet 12 is divided into a number of separate sheets 12A by cutter 46 operated by a suitable prime mover 48.

FIG. 2 illustrates the manner in which pyrolytic carbon deposits 50 are made on a fiber 52 within sheet material 12 when hydrocarbon gas impinges upon it in the direction of arrow 54, which designates the direction of flow of gas. It is believed that the distortion of carbon deposit is caused by the presence of eddy currents simulated by curved arrow 56 in back of fiber 52, which creates a low pressure area in back of fiber 52 in which the carbon deposits predominate. The downstream distortion of carbon deposit 50 does not interfer with the operation of sheets 12A as suitable fuel cell electrodes.

Figure 4:
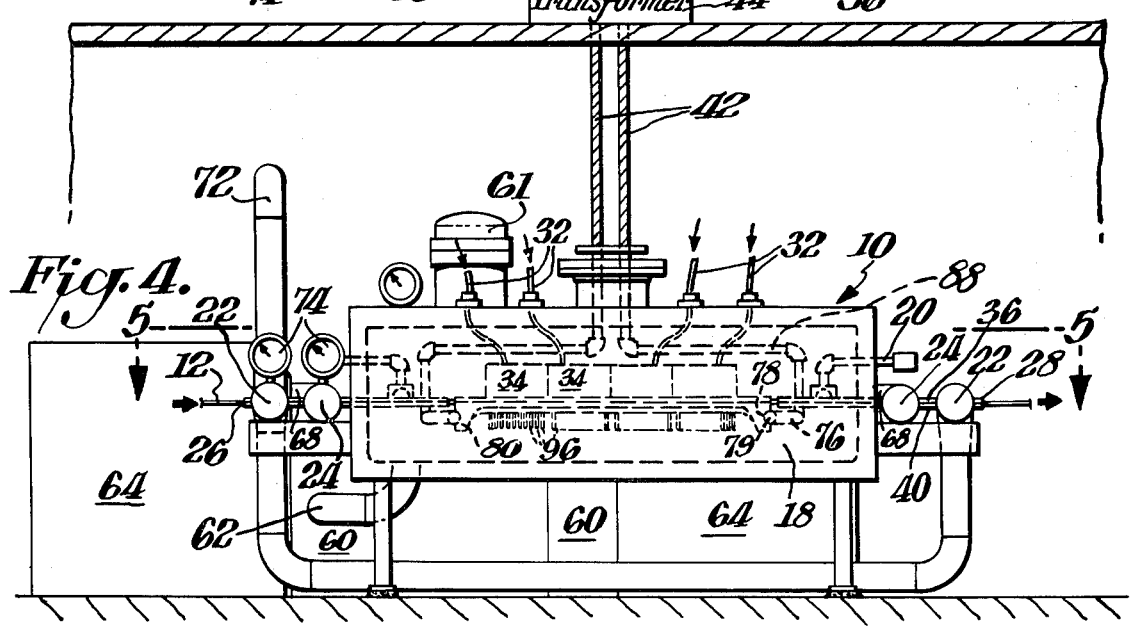
FIG. 4 is a front view in elevation of the apparatus and equipment shown in FIG. 3.

FIGS. 3 and 4 show a suitable arrangement of auxiliary apparatus 11, including vacuum equipment 58 which includes main vacuum pumps 60 connected to chamber 18 through valve manifold 59, filter 61 and main conduit 62. Two booster vacuum pumps 64 also included. Booster vacuum pumps 64 are each connected to inner tandem vacuum chambers 24 by conduits 68. Outer tandem vacuum plenums 22 are connected to condenser 70 through conduit 72. Condenser 70 condenses the exhaust of the steam evactor 71 in the vacuum system and removes it from the system.

FIGS. 5 and 6 show additional details of chamber 18 and included equipment. Entrance and exit throats 26 and 28 are formed by a spaced pair of steel plates joined at their sides to form the out portions of guide slot 38 through which sheet 12 is traversed. The subatmospheric pressure in auxiliary subatmospheric antechambers or plenums 22 and 24 are read on gauges 74 connected to them. Guide throats 26 and 28 also extend within chamber 18 close up to the treating portion of guide slot 38 formed between upper guide plate 36 and lower guide plate 40. Plates 36 and 40 are made, for example, of polycrystalline graphite, which is temperature resistant and capable of acting as an electrical resistance element for heating slot 38 and sheet 12 within it. Electrical current is conducted to the portion of lower plate 40 disposed over lower bridge 80 through hollow contact rods 79, which are forcefully pressed against accurate recesses 78 in the ends of lower bridge 80. Rods 79 are forced against recesses 78 by support rods 76, which are inserted through brackets 81, which are insulated from the bottom of the outer section of lower plate 40 by a sheet of insulating material 83, such as a phenolic plastic. Spring 84 reacts between the end of support rod 76 and hollow spring retainer 86, which is also mounted below outer section of lower plate 40 and insulated from it by a sheet of phenolic material 83. As shown in FIG. 4, electrical current supplied through cables 42 and electrical conduits 88 is connected to the aforementioned electrical heating assembly by the connection of electrical conduits 88 to support rods 76 by direct or indirect connections. Support rod 76 and contact rod 79 are made of water-cooled copper tubing. The structure which forms slot 38 can also be heated by any other suitable heating means, such as electrical induction heating.

FIGS. 7-9 show ports 90 through upper guide plate 36 and lower guide plate 40 for directing the flow of hydrocarbon gas against sheet 12 passing within slot 38 between plates 36 and 40. Ports 90 are, for example, about ½inch in diameter. In the illustrated apparatus plates 36 and 40 are about six ft. long and approximately 378 ports are provided through them. Plates 36 and 40 are about one and one-half ft. wide and slot 38 is about 40 mils thick or deep and about fourteen and one half inches wide to accommodate sheets up to about 13 inches wide.

Figure 10:
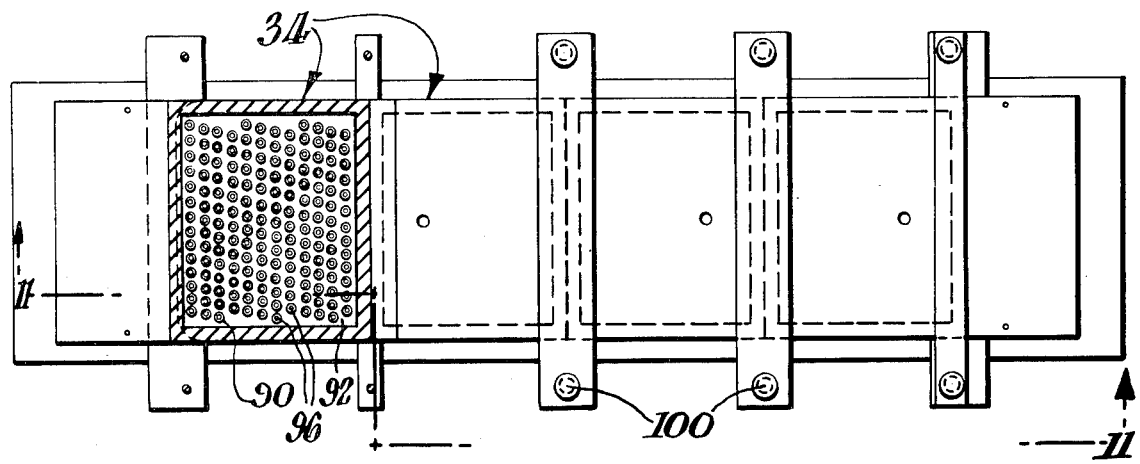
FIG. 10 is a top plan view of parts inside the subatmospheric chamber of the apparatus shown in FIGS. 5 and 6.
Figure 11:
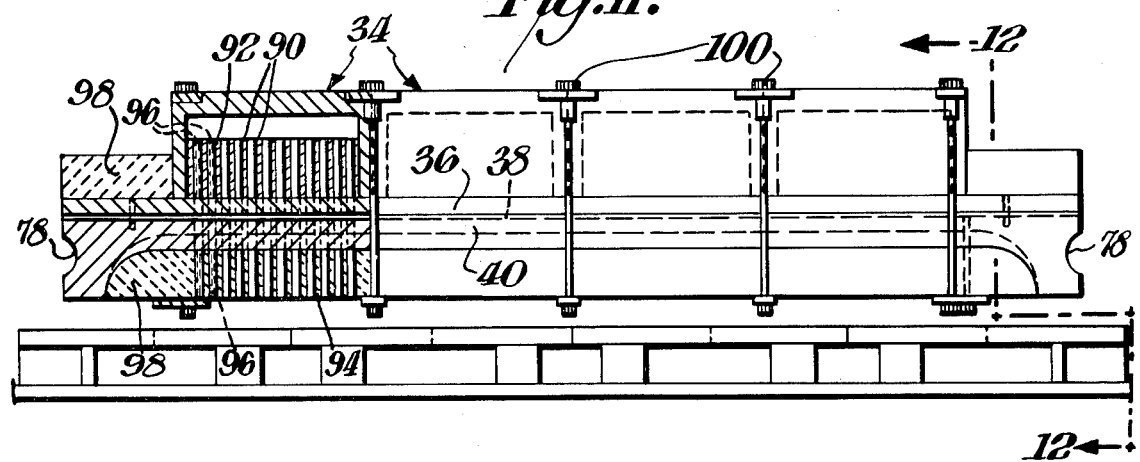
FIG. 11 is a cross-sectional view taken through FIG. 10 along the line 11—11.
Figure 12:
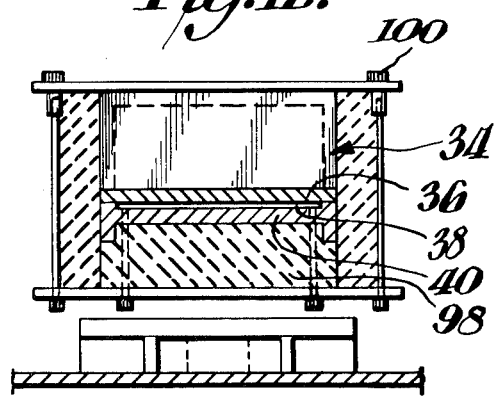
FIG. 12 is a cross-sectional view taken through FIG. 11 along the line 12—12.

FIGS. 10-12 show additional internal details within chamber 18 including distributing chambers 34 whose walls are made of polycrystalline graphite. Four distributing chambers 34 are provided. Within each of chambers 34 are provided channeled blocks 92 including flow passages 96 corresponding to each of ports 90 and aligned therewith. Flow passages 96 form relatively narrow or substantially restricted flow passages for directing hydrocarbon gas into and out of contact with sheet 12. A flow of hydrocarbon gas at a rate from about 5–20 cfm. to the overall apparatus provides relatively high velocities of flow within flow passages 96 and ports 90 aligned therewith of from about 20 to 200 (STP) ft. per minute. This relatively high velocity through passages 96 and ports 90 substantially cools the walls of the passages, which are also made of polycrystalline graphite, to prevent the graphite from depositing out on the walls of flow passages 96 and clogging them before the gas impinges on sheet 12. A similar block 94 is disposed under lower guide plate 40 in alignment with upper channeled block 92 with its passageways 96 in alignment with upper passageways having the same reference number. Lower channeled manifold 94 directs the gas away from sheet 12 after it has impinged upon it and deposits pyrolytic carbon on fibers 52 of sheet 12. As previously described, the exhausted and carbon-depleted gas is removed through the vacuum system. Auxiliary insulating blocks 98 are provided around chamber 18 to complete its structure through bolts 100 help connect the parts of chamber 18 together.

The rate and amount of the pyrolytic graphite deposit are controlled by: temperature of the sheet, velocity of the hydrocarbon gas, concentration of hydrocarbon in the gas and pressure of the gas. The gas is delivered through the tubes fast enough to prevent it from depositing on the walls of the tube, and the graphite deposits upon the hot porous fibrous sheet 12. The high velocity through the tubes unexpectedly prevents clogging them up by deposits of graphite and the impingement of the gas on the solid portions of the porous mat forms turbulent zones in back of the fibers in which the carbon deposits relatively quickly. Graphite deposits are, therefore, built up on the back sides of the carbon filaments, whereas the tubes do not collect appreciable amounts of carbon. This might be helped by the cooling effect of the rapidly flowing hydrocarbon gas. The high vacuum in chamber 18 prevents sooting caused by collisions of hydrocarbon molecules. Sooting can also be prevented by diluting the hydrocarbon gas with a gas like argon, hydrogen, ammonia, nitrogen or mixtures thereof.

Figure 13:
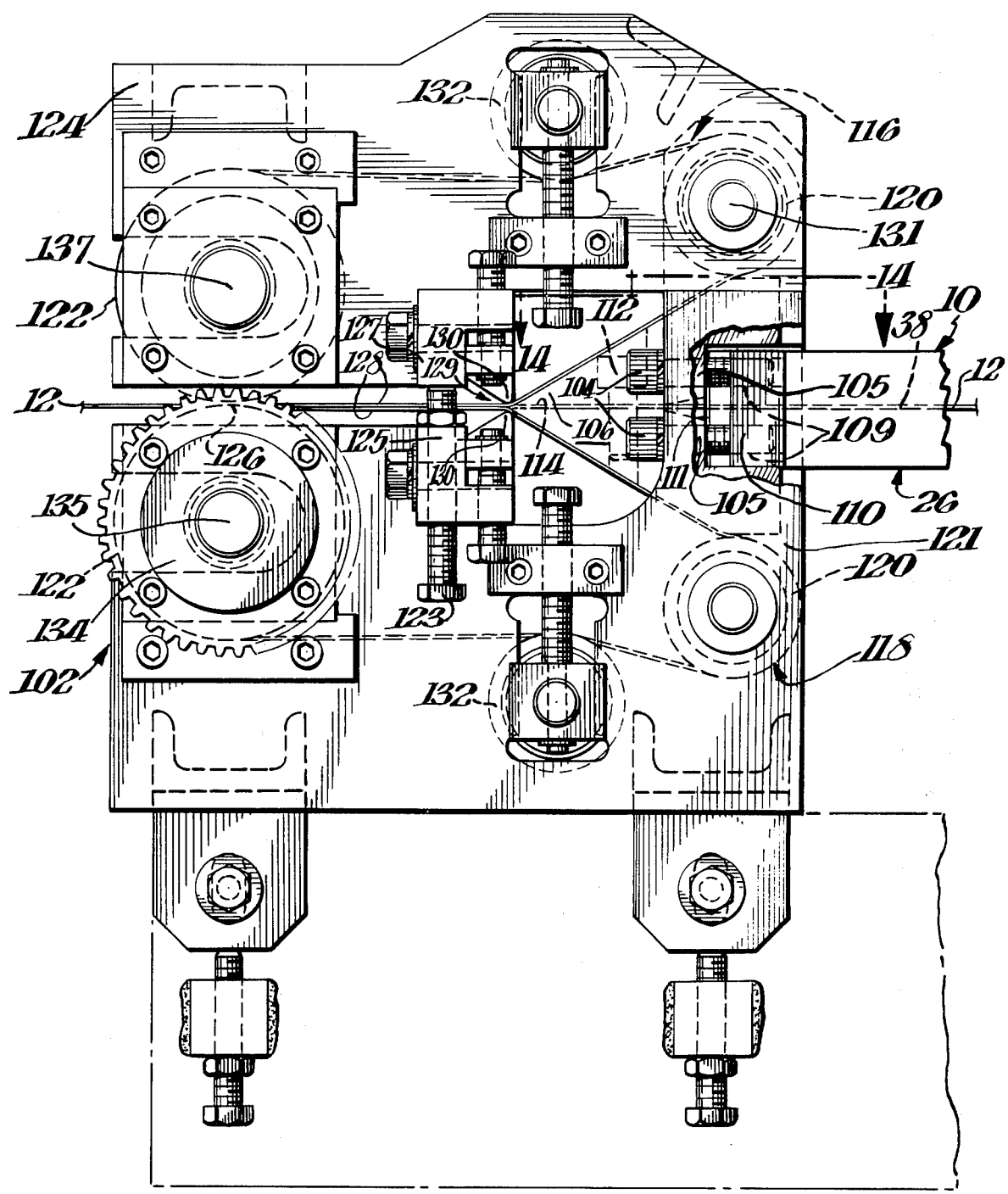
FIG. 13 is a side elevational view of a sheet-feeding and shielding device, a portion of which is broken away to illustrate the device mounted on the entrance end of the embodiment of this invention shown in FIGS. 1-12.

FIGS. 13–15 show an auxiliary sheet feeding and shielding device 102 disposed at the sheet-feeding end of apparatus 10. A similar device can also be mounted on the sheet-discharging end of apparatus 10.

Sheet-feeding device 102 is mounted on entrance throat 26 by cap screws 104 extending through flanges 105 on pointed nose pieces 106. Cap screws 104 are secured to entrance throat 26 by means of threaded sockets 109 in extension lugs 110 on the sides of entrance throat 26. FIGS. 13 and 14 also show gasket 111 between nose pieces 106 and entrance throat 26. Nose pieces 106 are secured together by cap screws 112 to leave a narrow slot 114 between them, which forms a continuation of slot 38 in apparatus 10.

Upper and lower parallel endless belt devices 116 and 118 are mounted adjacent the end of pointed nose pieces 106 to feed, shield and protect the porous fibrous sheet material 12 passing through apparatus 10. Upper and lower devices 116 and 118 are identical except for relative inversion. Each includes an inner pulley wheel 120 mounted between lower L-shaped brackets 121. Nose pieces 106 attached to entrance throat 26 are in turn disposed between pulley wheels 120. Outer upper pulley wheel 122 is mounted between side plates 124 a short distance away from lower outer pulley wheel 122 mounted on lower bracket 121.

A nominal clearance or a nip 126 is formed between pulleys 122 by an adjustment bolt 123. Bolt 123 is rotatably held in fixed block 125 on lower bracket 121 and interacts with fixed block 127 on upper bracket 124 causing rotation of bracket 121 about axis 131.

The length of the parallel run of belts 128 between outer pulley nip or clearance 126 and nose piece 106 is approximately 9 inches (228.6 mm) which provides a sheath for enveloping fibrous porous sheet material 12. Vertical adjustable upper and lower triangular guide blades 130 maintain endless belts 128 closely engaged upon the tip of pointed nose pieces 106. Adjustable upper and lower idler pulleys 132 maintain endless belts 128 taut.

Belts 128 are, for example, clear Mylar about 0.008 inch thick (0.203 mm) 17 inches (43.2 mm) wide and 21 inches (53.3 mm) in peripheral length. Mylar is the trademark of E.I. DuPont DeNemours for a highly durable, transparent, water-repellent film of polyethylene terephthalate resin. Characterized by outstanding strength, electrical properties, and chemical inertness. It may be used from 60° to 150° C because of its inherent thermal stability. It is available in thickness from 0.0025 to 0.0075 inch, and in several types for specific applications. It is used: primarily as electrical insulation for capacitors, motors, generators and transformers, and as a barrier tape for wire and cable; may also be used for many non-electrical applications such as decorative laminations, vapor-barrier materials, as printed cover for acoustical tile, and various types of industrial tapes and magnetic recording tapes.

Any joint in the belt must be flat and it is conveniently ultrasonically welded. The belts must also be vacuum tight in the applicable pressure range.

Rotating power is provided to endless belt device 102 through torque limiter 134 to shaft 135 on which is mounted lower outer pulley wheel 122. Upper shaft 137 is connected to rotate with lower shaft 135 through spur gear device 139 at the side of device 102 opposite torque limiter 134. The speed of drive is sufficient to maintain suitable feeding tension on sheet material 12. When feeding device 102 is provided at both ends of apparatus 10, the relative speeds are adjusted to maintain the sheet material as free from stress as possible. Devices 102 when installed at both ends of apparatus 10 are, therefore, synchronized with each other to provide just the right amount of tension to accommodate any shrinking or expansion which may occur within apparatus 10.

Feeding device 102 minimizes aerodyanmic shear and disturbances which occur when fibrous porous sheet material 12 passes between the atmosphere and the vacuum seals at the entrance and exit throats 26 and 28 on apparatus 10. Entrance throat 26 is mounted on entrance vacuum plenum 22 and exit vacuum throat 28 is mounted on exit vacuum plenum 22. Some types of porous fibrous sheet material 12 is extremely weak against shear force, and are subject to breakage when entering and leaving apparatus 10. Endless belt devices 116 and 118 are arranged in conjunction with pointed nose piece 106 to provide a sheath 129 between the parallel runs of endless belts 128. The vacuum in entrance throat 26 and the relatively higher atmospheric pressure on the other side of belts 128 force belts 128 into intimate contact with pointed nose pieces 126, and with the sheet material 12 fed. Sheath 129 is, therefore, provided by differential pressure about sheet material 12. This provides a vacuum seal about sheet material 12 as it enters or exits through apparatus 10, which also helps support relatively weak sheet material 12 against breakage by fluctuations in atmospheric pressure, which otherwise occur at the entrance to throat 26 and the exit from throat 28. Positive protection and support of sheet material 12, is therefore, provided together with an almost perfect vacuum seal at both ends of apparatus 10. Sheet-feeding device 102 is so effecient that one such device by by itself positively feed sheet material 12 through apparatus 10.

I claim:

1. An apparatus for the continuous vapor deposition of pyrolytic graphite on a porous fibrous sheet of carbon material comprising a subatmospheric pressure chamber, a pair of elongated guide plates disposed parallel to and adjacent to each other within the chamber forming a narrow slot between them through which the porous fibrous carbon sheet is longitudinally traversed, flow passes though said plates having substantially restricted flow areas, the flow passages intersecting the slot, exhaust means connected to the chamber for maintaining the subatmospheric pressure in the chamber, feed means for causing the elongated porous fibrous sheet of carbon to longitudinally move through the slot, electrical heating means associated with at least one of the guide plates for heating it and the sheet adjacent it, a source of hydrocarbon gas under pressure connected to the flow passages for causing the relatively high velocity flow of hydrocarbon gas to pass through and to cool the flow passages and to impinge upon the sheet whereby a deposit of pyrolytic graphite is infiltrated on the sheet without clogging the flow passages seal means including at least at one end of the apparatus, the device having a pair of endless belts having a substantial length of each disposed substantially parallel to form a sheath adjacent each other, and said sheath intersecting an extension of the slot disposed between the pair of the elongated guide plates in a region having subatmospheric pressure whereby the sheath is caused to closely envelope and support the porous fibrous sheet of material as a result of the differential pressure of ambient atmospheric pressure relative to the subatmospheric pressure between the belts in the sheath, a pointed nose piece attached to the said one end of the apparatus, the endless belt device being constructed and arranged to cause the belts to be disposed close to the nose piece just ahead of the sheath and belt guide means on the endless belt device which contacts the belts adjacent the end of the pointed nose piece for maintaining the endless belts close to it whereby a vacuum seal is provided for the chamber, a subatmospheric antechamber disposed on the chamber in the path of travel of the porous fibrous sheet material, and the pointed nose piece being connected to the end of the subatmospheric antechamber.

2. An apparatus as set forth in claim 1 wherein subatmospheric antechambers are disposed in the path of travel of the sheet on both sides of the subatmospheric chamber to help maintain the subatmospheric pressure in the chamber.

3. An apparatus as set forth in claim 2 wherein a pair of subatmospheric antechambers are disposed on each side of the subatmospheric chamber.

4. An apparatus as set forth in claim 3 wherein auxiliary exhaust means is connected to the outer of the pair of antechambers for maintaining a subatmospheric pressure in them from about 760–70 mm. of Hg.

5. An apparatus as set forth in claim 4 wherein auxiliary exhaust means is connected to the inner of the pair of antechambers for maintaining a subatmospheric pressure in them from about 70–5 mm. of Hg.

6. An apparatus as set forth in claim 1 wherein a cutting device is disposed at the end of the path of travel of the sheet for cutting it into individual sheets.

7. An apparatus as set forth in claim 1 wherein the slot is approximately 40 mils thick.

8. An apparatus as set forth in claim 1 wherein the cross-sectional flow area of each of the flow passages is approximately 0.1 to 0.3 square inches.

9. An apparatus as set forth in claim 1 wherein the elongated guide plates are comprised of polycrystalline graphite.

10. An apparatus as set forth in claim 9 wherein channeled blocks are provided contiguous to the guide plates, and the channeled blocks have flow passages aligned with the flow passages in the guide plates.

11. An apparatus as set forth in claim 10 wherein the channeled blocks are made of polycrystalline graphite.

12. An apparatus as set forth in claim 9 wherein a bridge plate is mounted contiguous to and under the lower elongated guide plate for supporting it and conducting electrical current to it, and electrical contact means removably engaging the bridge plate for conducting electrical energy thereto.

13. An apparatus as set forth in claim 12 wherein the guide plates and bridge plate are made of polycrystalline graphite.

14. An apparatus for the continuous vapor deposition of pyrolytic graphite on a porous fibrous sheet of carbon material comprising a subatmospheric pressure chamber, a pair of elongated polycrystalline graphite guide plates disposed parallel to and adjacent to each other within the chamber forming a narrow slot between them through which the porous fibrous carbon sheet is longitudinally traversed, flow passages through said plates having substantially restricted flow areas, the flow passages intersecting the slot, exhaust means connected to the chamber for maintaining the subatmospheric pressure in the chamber, feed means for causing the elongated porous fibrous sheet of carbon to longitudinally move through the slot, electrical heating means associated with at least one of the guide plates for heating it and the sheet adjacent it, a source of hydrocarbon gas under pressure connected to the flow passages for causing the relatively high velocity flow of hydrocarbon gas to pass through and to cool the flow passages and to impinge upon the sheet whereby a deposit of pyrolytic graphite is infiltrated on the sheet without clogging the flow passages, and channeled blocks provided contiguous to the guide plates and having flow passages therethrough aligned with the flow passages in the guide plates.

15. An apparatus as set forth in claim 14 wherein subatmospheric antechambers are disposed in the path of travel of the sheet on both sides of the subatmospheric chamber to help maintain the subatomospheric pressure in the chamber.

16. An apparatus as set forth in claim 15 wherein a pair of subatmospheric antechambers are disposed on each side of the subatmospheric chamber.

17. An apparatus as set forth in claim 16 wherein auxiliary exhaust means is connected to the outer of the pair of antechambers for maintaining a subatmospheric pressure in them from about 760–70 mm. of Hg.

18. An apparatus as set forth in claim 17 wherein auxiliary exhaust means is connected to the inner of the pair of antechambers for maintaining a subatmospheric pressure in them from about 70–5mm. of Hg.

19. An apparatus as set forth in claim 14 wherein a cutting device is disposed at the end of the path of travel of the sheet for cutting it into individual sheets.

20. An apparatus as set forth in claim 14 wherein the slot is approximately 40 mils thick.

21. An apparatus as set forth in claim 14 wherein the crosssectional flow area of each of the flow passages is approximately 0.1 to 0.3 square inches.

22. An apparatus as set forth in claim 14 wherein a parallel endless belt sheet feeding device is disposed at least at one end of the apparatus, the device having a pair of endless belts having a substantial length of each disposed substantially parallel to form a sheath adjacent each other, and said sheath intersecting an extension of the slot disposed between the pair of the elongated guide plates in a region having subatmospheric pressure whereby the sheath is caused to closely envelope and support the porous fibrous sheet of material as a result of the differential pressure of ambient atmospheric pressure relative to the subatmospheric pressure between the belts in the sheath.

23. An apparatus as set forth in claim 14 wherein the channeled blocks are made by polycrystalline graphite.

24. An apparatus as set forth in claim 22 wherein a pointed nose piece is attached to the end of the apparatus, the endless belt device being constructed and arranged to cause the belts to be disposed close to the nose piece just ahead of the sheath and belt guide means on the endless belt device which contacts the belts adjacent the end of the pointed nose piece for maintaining the endless belts close to it whereby a vacuum seal is provided for the chamber.

25. An apparatus as set forth in claim 24 wherein a subatmospheric antechamber is disposed on the chamber in the path of travel of the porous fibrous sheet material, and the pointed nose piece is connected to the end of the subatmospheric antechamber.

26. An apparatus as set forth in claim 14 wherein a bridge plate is mounted contiguous to and under the lower elongated guide plate for supporting it and conducting electrical current to it, and electrical contact means removably engaging the bridge plate for conducting electrical energy thereto.

27. An apparatus as set forth in claim 26 wherein the bridge plate is made of polycrystalline graphite.

* * * * *